(12) United States Patent
Law et al.

(10) Patent No.: US 10,056,291 B2
(45) Date of Patent: Aug. 21, 2018

(54) POST SPACER SELF-ALIGNED CUTS

(71) Applicant: GLOBALFOUNDRIES INC., Grand Cayman (KY)

(72) Inventors: Shao Beng Law, Watervliet, NY (US); Xunyuan Zhang, Albany, NY (US); Frank W. Mont, Troy, NY (US); Genevieve Beique, Clifton Park, NY (US); Lei Sun, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/360,255

(22) Filed: Nov. 23, 2016

(65) Prior Publication Data

US 2018/0144976 A1 May 24, 2018

(51) Int. Cl.
| | |
|---|---|
| *H01L 21/4763* | (2006.01) |
| *H01L 21/768* | (2006.01) |
| *H01L 21/033* | (2006.01) |
| *H01L 21/311* | (2006.01) |
| *H01L 21/027* | (2006.01) |
| *H01L 23/528* | (2006.01) |
| *H01L 21/3205* | (2006.01) |
| *H01L 21/285* | (2006.01) |

(52) U.S. Cl.
CPC .... *H01L 21/76816* (2013.01); *H01L 21/0276* (2013.01); *H01L 21/0332* (2013.01); *H01L 21/0337* (2013.01); *H01L 21/28556* (2013.01); *H01L 21/28568* (2013.01); *H01L 21/31144* (2013.01); *H01L 21/32051* (2013.01); *H01L 21/76877* (2013.01); *H01L 23/5283* (2013.01)

(58) Field of Classification Search
CPC .......... H01L 23/5226; H01L 21/76897; H01L 27/1203; H01L 21/7624
USPC ......... 438/622, 626, 637, 645; 257/750, 758
See application file for complete search history.

(56) References Cited

U.S. PATENT DOCUMENTS

| | | | |
|---|---|---|---|
| 9,281,212 B1 | 3/2016 | Glodde et al. | |
| 9,368,350 B1 | 6/2016 | He et al. | |
| 9,478,462 B1 | 10/2016 | Wang et al. | |
| 2007/0020928 A1* | 1/2007 | Albertson | ......... H01L 21/76834 438/672 |
| 2007/0170574 A1 | 7/2007 | Lauxtermann et al. | |
| (Continued) | | | |

OTHER PUBLICATIONS

Specification "Self-Aligned Lithographic Patterning" and Drawings in U.S. Appl. No. 15/359,037, filed Nov. 22, 2016, 19 pages.

(Continued)

*Primary Examiner* — S. V. Clark
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to post spacer self-aligned cut structures and methods of manufacture. The method includes: providing a non-mandrel cut; providing a mandrel cut; forming blocking material on underlying conductive material in the non-mandrel cut and the mandrel cut; forming trenches with the blocking material acting as a blocking mask at the mandrel cut and the non-mandrel cut; and filling the trenches with metallization features such that the metallization features have a tip to tip alignment.

19 Claims, 5 Drawing Sheets

(56) References Cited

U.S. PATENT DOCUMENTS

| | | |
|---|---|---|
| 2008/0032508 A1 | 2/2008 | Chang |
| 2011/0117723 A1* | 5/2011 | Seidel .................. B81B 7/0006 |
| | | 438/430 |
| 2012/0282779 A1 | 11/2012 | Arnold et al. |
| 2014/0148012 A1 | 5/2014 | Guillorn et al. |
| 2014/0315380 A1 | 10/2014 | Kanakasabapathy et al. |
| 2015/0048430 A1 | 2/2015 | He et al. |
| 2015/0243518 A1 | 8/2015 | deVilliers |
| 2017/0018499 A1* | 1/2017 | Chen .................. H01L 23/5256 |

OTHER PUBLICATIONS

Office Action in the related U.S. Appl. No. 15/359,037 dated Jun. 29, 2017, 7 pages.
Office Action in the related U.S. Appl. No. 15/359,037 dated Dec. 21, 2018, 7 pages.
Office Action in the related U.S. Appl. No. 15/457,200 dated Mar. 21, 2018, 11 pages.
Notice of Allowance in the related U.S. Appl. No. 15/359,037 dated May 21, 2018, 8 pages.

* cited by examiner

POST SPACER SELF-ALIGNED CUTS

FIELD OF THE INVENTION

The present disclosure relates to semiconductor structures and, more particularly, to post spacer self-aligned cut structures and methods of manufacture.

BACKGROUND

Self-aligned cuts are critical for smaller technology nodes, e.g., 7 nm nodes and beyond, to mitigate edge placement error (EPE). Self-aligned cuts can be achieved through pillar technology or trench lithography and tone inversion approaches with careful multiple materials selection with high etch selectivity.

As dimensions shrink beyond 7 nm nodes, e.g., <40 nm pitch, the trench and tone inversion approach becomes the preferred path due to narrower lithographic printability margin/flop, compared to the conventional pillar approach. However, the trench and tone inversion approach creates additional steps and complexities that require, e.g., good gap fill, planarization material. In addition, the trench and tone inversion approach for smaller technologies requires new materials that can have superior etch selectivity. However, using new materials would create additional issues. These issues range from the need for new etch back or CMP processes to the optimization of the RIE processes, each of which would have a prolonged learning cycle when introduced into the fabrication environment.

SUMMARY

In an aspect of the disclosure, a method comprises: providing a non-mandrel cut; providing a mandrel cut; forming blocking material on underlying conductive material in the non-mandrel cut and the mandrel cut; forming trenches with the blocking material acting as a blocking mask at the mandrel cut and the non-mandrel cut; and filling the trenches with metallization features such that the metallization features have a tip to tip alignment.

In an aspect of the disclosure, a method comprises: exposing a conductive material by removing masking material between sidewall spacers of selected mandrels; exposing the conductive material by removing other selected mandrels, while keeping the sidewall spacers associated with the other selected mandrels; growing blocking material on the exposed conductive material; forming trenches through the conductive material and underlying material, with the blocking material acting as a tip to tip blocking mask; and removing at least the blocking material; and forming metallization features in the trenches, which are aligned tip to tip.

In an aspect of the disclosure, a structure comprises a metallization feature in tip to tip alignment with another metallization feature and separated by insulator material.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to post spacer self-aligned cut structures and methods of manufacture. More specifically, the present disclosure facilitates two post spacer self-aligned cuts by self-direct deposition methods using trench and tone inversion approaches. Advantageously, the materials used in the spacer self-aligned cut structures described herein are readily available in current process of record (POR) manufacturing environments, thus eliminating the requirement for additional steps and/or other complexities in the fabrication processes.

In embodiments, the materials provide selective CVD deposition processes for trench lithography and tone inversion (e.g., lithography+tone) to form tip to tip block masks, dummy removal masks, and wider spaces and areas outside of the minimum macro area. For example, the materials implemented herein can include, e.g., Co or Ru, which provide superior etch selectivity. By using Co or Ru, the approaches described herein do not pose any additional issues during fabrication processes, e.g., new etch back or CMP processes for new materials or optimization of the RIE processes, each of which would have a prolonged learning cycle when introduced into the fabrication environment. Also, the materials and processes used herein provide simple, manufacturable back end of the line (BEOL) integration cut flow for different technology nodes, e.g., 7 nm and below technology nodes.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

Figure 1:
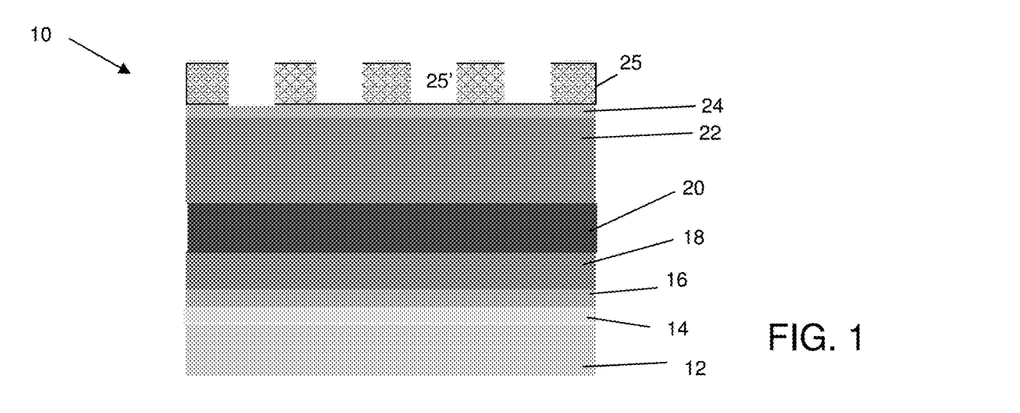
FIG. 1 shows a structure and respective fabrication processes in accordance with aspects of the present disclosure.

FIG. 1 shows a structure and respective fabrication processes in accordance with aspects of the present disclosure. The structure 10 includes a substrate 12 comprising, e.g., a low-k dielectric material. In embodiments, the substrate 12 can be provided on an N-block, as one example. A sacrificial material 14, e.g., SiN, is deposited on the substrate 12 using conventional deposition methods. For example, the deposition of the sacrificial material 14 can be provided by a chemical vapor deposition (CVD) process. The sacrificial material 14 can be deposited to a thickness of about 20 nm; although other dimensions are also contemplated herein.

Still referring to FIG. 1, a material 16, e.g., SiN, is deposited on the sacrificial material 14, followed by a deposition of conductive material 18. In embodiments, the conductive material 18 can be TiN; although other metal or metal alloy materials are contemplated herein. A mandrel material 20 is deposited on the conductive material 18. In embodiments, the mandrel material 20 can be amorphous silicon deposited to a thickness of about 80 nm; although other dimensions are also contemplated herein.

An ODL or OPL material 22 is deposited on the mandrel material 20 to a thickness of about, e.g., 100 nm; although other dimensions are also contemplated herein. Following the deposition of the ODL or OPL material 22, an anti reflective coating 24 (e.g., Si anti reflective coating (ARC)) is deposited on the ODL or OPL material 22. A resist 25 deposited on the ARC 24 is exposed to energy (light) to form a pattern (openings) 25'. It should be understood that the ODL, ARC and resist are lithographic stack of material, and that the lithography processes described in any of the figures can be supported by, e.g., optical, EUV or other known types of lithography.

Figure 2:
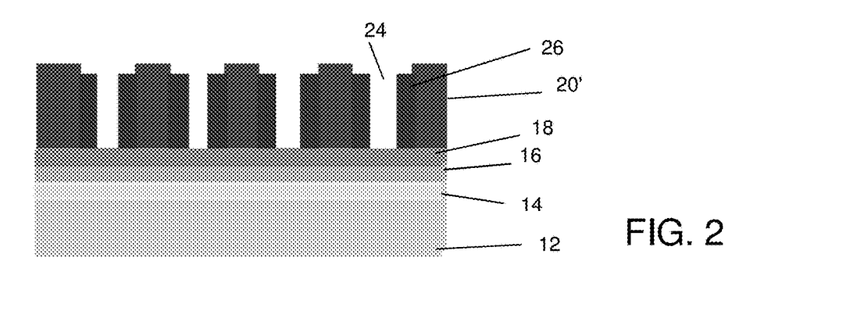
FIG. 2 shows mandrels with sidewalls, amongst other features, and respective fabrication processes in accordance with aspects of the present disclosure.

In FIG. 2, multiple mandrels 20 and trenches 24 between the mandrels 20 are formed by conventional etching processes through the openings 25' of the resist, followed by stripping of the materials 22, 24, 25. For example, after the openings 25' are formed in the resist 25, an etching process with a selective chemistry, e.g., reactive ion etching (RIE), will be used to form one or more trenches 24 through the openings 25' of the resist 25, resulting in the formation of multiple mandrels 20'. The resist 25' is then be removed by a conventional oxygen ashing process or other known stripants, followed by the removal of the materials 22, 24 by conventional stripping methods. In embodiments, for a 7 nm node, the trenches 24 can have a cross sectional dimension, e.g., width or circumference of about 20' nm; although other dimensions are contemplated herein depending on the technology node.

Still referring to FIG. 2, following the material removal, e.g., materials 22, 24, 25, sidewall spacers 26 are formed on the mandrels 20'. The sidewall spacers 26 can be an oxide based insulator material, e.g., $SiO_2$. In embodiments, the sidewall spacers 26 can be deposited by a blanket deposition process, followed by a recessing or pull down etch process, e.g., isotropic etching process. In this way, sidewalls will remain on the multiple mandrels 20', below a top surface thereof. That is, after the etch back process the top surfaces of the multiple mandrels 20' will be exposed, as well as the conductive material 18 between the sidewall spacers 26.

Figure 3:
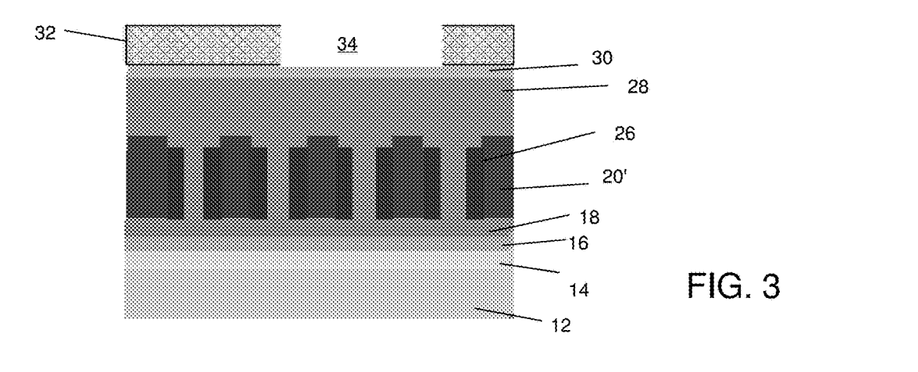
FIG. 3 shows lithographic stack of materials above the mandrels, amongst other features, and respective fabrication processes in accordance with aspects of the present disclosure.

In FIG. 3, an ODL or OPL material 28 is deposited on the sidewall spacers 26 and mandrels 20' to a thickness of about, e.g., 100 nm; although other dimensions are also contemplated herein. Following the deposition of the ODL or OPL material 28, an anti reflective coating 30 (e.g., Si anti reflective coating (ARC)) is deposited on the ODL or OPL material 28. A resist 32 deposited on the ARC 30 is then exposed to energy (light) to form a pattern (opening) 34.

Figure 4:
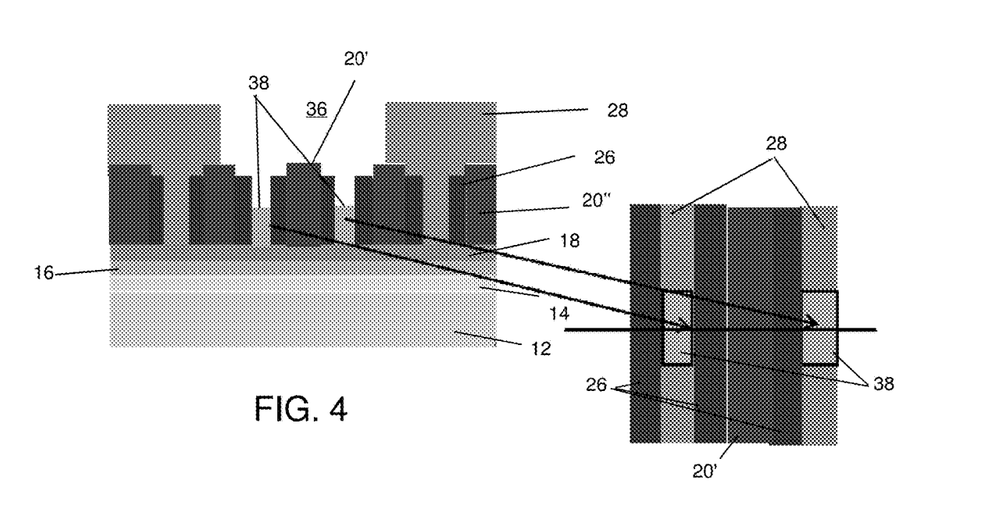
FIG. 4 shows metallization features between selected mandrels, amongst other features, and respective fabrication processes in accordance with aspects of the present disclosure.

In FIG. 4, an opening 36 is formed within the ODL or OPL material 28 and the ARC 30 to expose underlying conductive material 18, e.g., TiN, between selected mandrels 20'. As shown in FIG. 4, the ODL or OPL material 28 can remain over other mandrels 20" thereby blocking the underlying conductive material 18. Following the exposure of the underlying conductive material 18, a material 38, e.g., Co or Ru, is selectively grown on the exposed underlying conductive material 18. The sidewall spacers 26 will ensure that the Co material or Ru material 38 is spaced away from the mandrels 20'. The Co material or Ru material 38 will act as a tip to tip mask in the non-mandrel cut (and the mandrel cut). The steps thus far described can also be repeated for multiple non-mandrel cuts.

In embodiments, the material 38 can be grown to a height of about 20 nm for a 7 nm technology node; although this height will be dependent on technology node. In any technology node, it is preferred that the material 38 be grown to a height below the height of the mandrels 20'. Due to the selective growth of the material 38, it is expected that the Co or Ru material will grow to a same thickness regardless of the opening dimension. Also, the Co or Ru material can be grown to a uniform thickness regardless of the shape or size of the opening. Also, as should be understood by those of skill in the art, the Co or Ru material 38 will only grow on the conductive material (e.g., metal or metal alloy).

Advantageously, Co material or Ru material can be used to define tip to tip/wider space/dummy metal removal for a non-mandrel (and mandrel) region as described herein. Also, by using Co material or Ru material, there is no need to use a spin on gap fill material (e.g., metal oxides including TiOx, ZrOx etc), nor is there a need for RIE etch back or CMP, as Co material or Ru material can be grown to a height below that of the mandrels 20'. Moreover, by using Co material or Ru material, there is no BEOL temperature budget concern, as CVD Co or Ru is about 250° C. In addition, the Co or Ru material exhibits excellent etch selectivity to other film stacks and can be engineered to different processing flows.

These same advantages are also provided with the following fabrication processes using the Co material or Ru material in mandrel cuts. For example, as shown in FIGS. 5-8, OPL or ODL material can be used to protect non-mandrel lines, e.g., material 38, while releasing a-Si at a mandrel cut of interest to allow a self-direct CVD of Co/Ru deposition, forming a block mask for the mandrel line. The schemes shown in FIGS. 5-8 can be repeated to provide multiple mandrel cuts, if needed.

Figure 5:
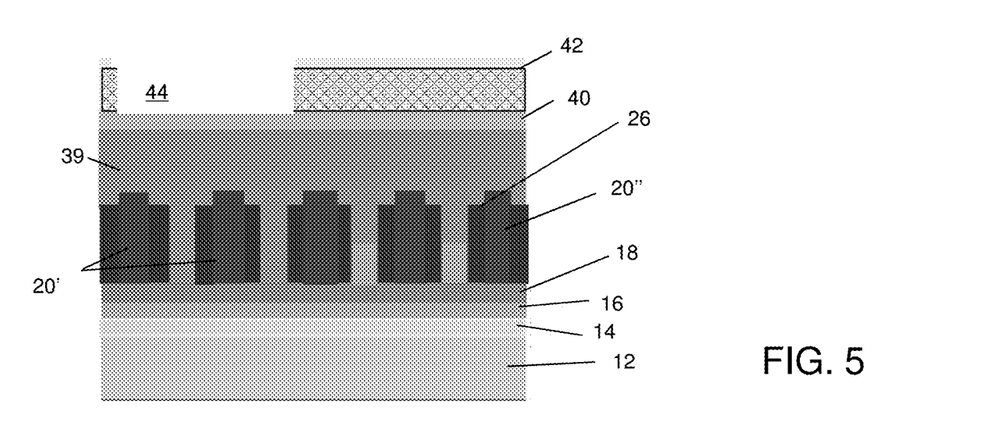
FIG. 5 shows lithographic stack of materials above the mandrels and metallization features, amongst other features, and respective fabrication processes in accordance with aspects of the present disclosure.

More specifically, as shown in FIG. 5, after removal of the ODL or OPL material and the ARC which was used for the formation of the Co material or Ru material 38 on the exposed underlying conductive material 18, another ODL or OPL material 39, ARC 40 and resist material 42 are formed on the Co material or Ru material 38 and the mandrels 20", 20'. The resist 42 is exposed to energy (light) to form a pattern (opening) 44 aligned with mandrels 20' that do not have Co material or Ru material or therebetween.

Figure 6:
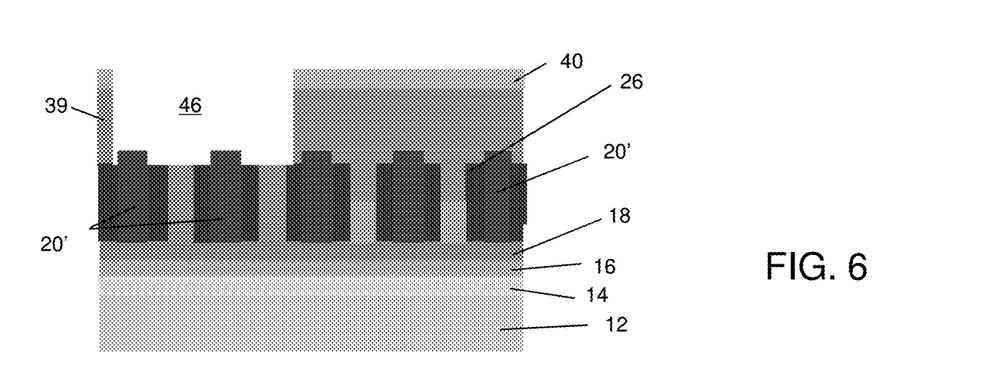
FIG. 6 shows an opening in the lithographic stack of materials exposing selected mandrels, amongst other features, and respective fabrication processes in accordance with aspects of the present disclosure.
Figure 7:
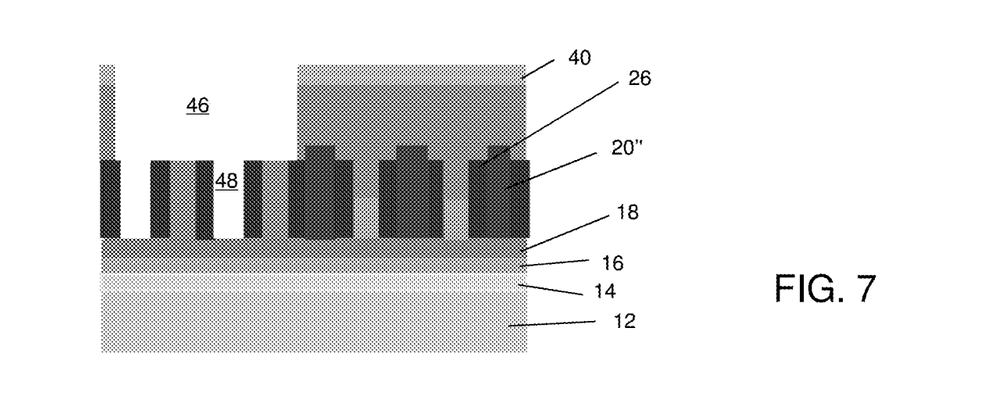
FIG. 7 shows openings between selected mandrels exposing an underlying conductive material, amongst other features, and respective fabrication processes in accordance with aspects of the present disclosure.

In FIG. 6, an opening 46 is formed within the ODL or OPL material 39 and the ARC 40 to expose selected mandrels 20', e.g., amorphous Si material and sidewall spacers 26. More specifically, a conventional pull-back process can be used to partial etch back the ODL or OPL material 39, exposing the mandrels 20'. In embodiments, the ODL or OPL material 39 will remain over other mandrels 20" and the Co material or Ru material 38 therebetween. The resist material can be removed by a conventional stripping process, e.g., oxygen ashing As shown in FIG. 7, the exposed mandrels can be removed by a conventional etching process, e.g., RIE, which has selective chemistries to the amorphous Si material of the selected mandrels 20'. In this fabrication process, the OPL or ODL material 39 will protect the non-mandrel lines, e.g., the Co material or Ru material 38 between mandrels 20". The removal of the mandrel material will form trenches 48, exposing the underlying conductive material 18.

Figure 8:
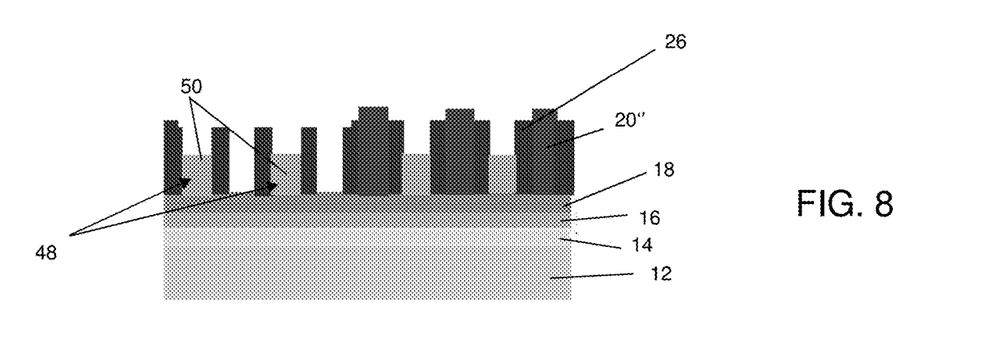
FIG. 8 shows metallization features between selected mandrels, amongst other features, and respective fabrication processes in accordance with aspects of the present disclosure.

In FIG. 8, material 50, e.g., Co or Ru, is selectively grown on the exposed underlying conductive material 18. In embodiments, the material 50 can be grown to a height of about 20 nm for a 7 nm technology node, or other height depending on the technology node. In any technology node, it is preferred that the material 50 be grown in the trenches 48 to a height below the height of the mandrels 20'. The sidewall spacers 26 will ensure that the Co material or Ru material 38 is spaced away from the mandrels 20'. The remaining OPL or ODL material 39 can now be removed, exposing the conductive material 18 and the Co material or Ru material 38. In this way, the Co material or Ru material 38, 50 can now act as a blocking material for the mandrel cut and the non-mandrel cut.

Figure 9:
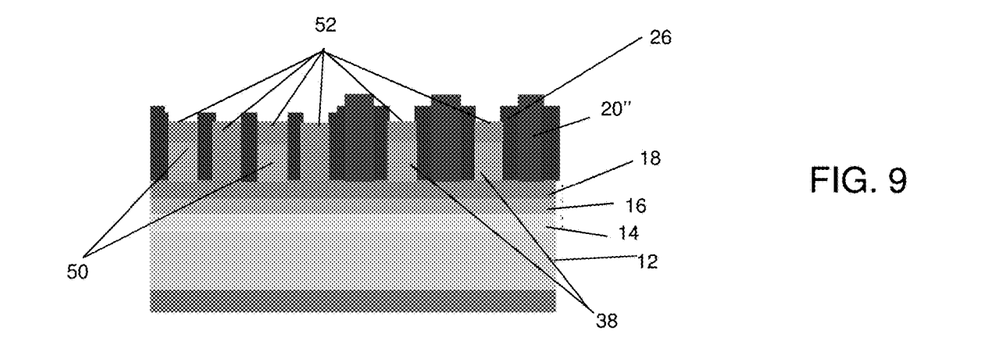
FIG. 9 shows masking material over the metallization features and conductive material between selected mandrels, amongst other features, and respective fabrication processes in accordance with aspects of the present disclosure.

In FIG. 9, the exposed surfaces of the structure of FIG. 8 are covered by additional ODL or OPL material 52, followed by a partial etch back process such that the sidewall spacers 26 and mandrels 20', 20" are exposed. More specifically, the additional ODL or OPL material 52 will cover the material 38, 50, and conductive material 18 followed by an etch back process so that sidewall spacers 26 and any mandrels are exposed.

Figure 10:
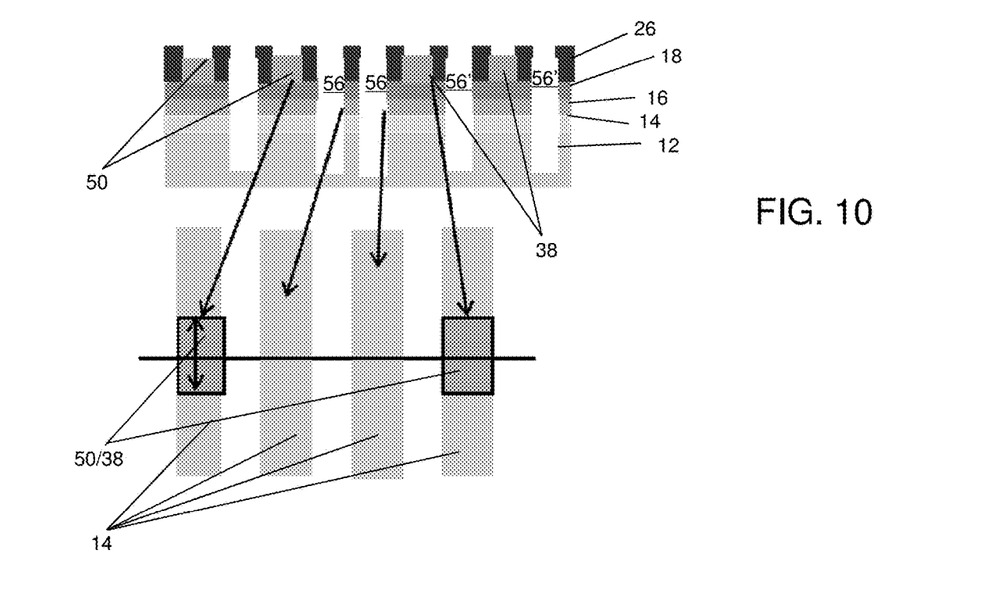
FIG. 10 shows trenches between sidewalls of removed mandrels, amongst other features, and respective fabrication processes in accordance with aspects of the present disclosure.

In FIG. 10, all of the exposed mandrels are removed by a selective etching process, selective to the amorphous material. It should be recognized by those of skill in the art that other material can be used for the mandrels, so long as it is different than other exposed material thus allowing for selective etching processes. Following the removal of the mandrels, the ODL or OPL material 52 can also be removed by conventional processes. Trenches 56 are then be formed through material 12, 14, 16 and 18, by RIE processes with selective chemistries to the materials being removed. The sidewall spacers 26 will define a spacing between the trenches 56; whereas the sidewall spacers and material 38/50 will define a spacing between trenches 56'. At this fabrication stage, the Co material or Ru material 38, 50 will act as a tip to tip masking material for trench formation and subsequent trench fill processes.

Figure 11:
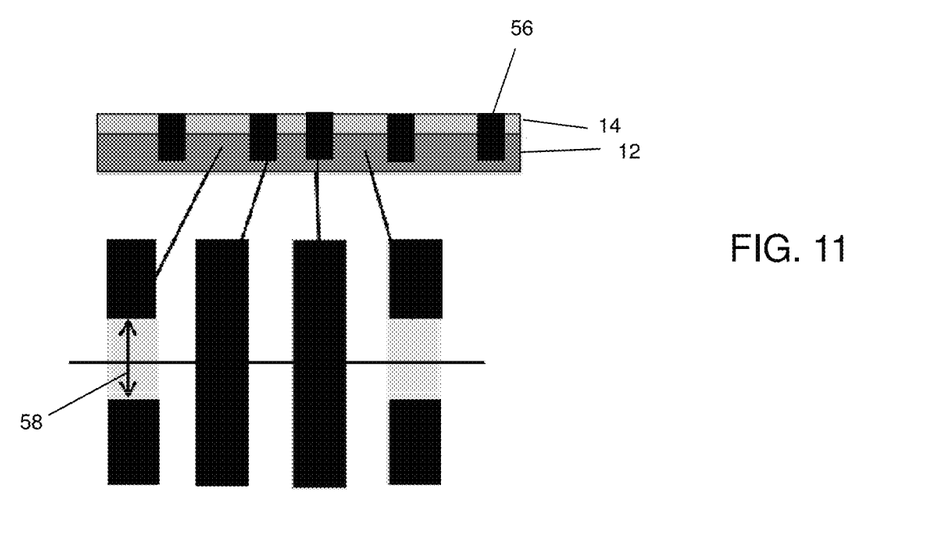
FIG. 11 shows wiring structures within trenches and tip to tip alignment, amongst other features, and respective fabrication processes in accordance with aspects of the present disclosure.

FIG. 11 shows wiring structures within trenches and tip to tip alignment, amongst other features, and respective fabrication processes in accordance with aspects of the present disclosure. More specifically, in FIG. 11, the materials 16, 18, 26, 38/50 are removed by RIE processes with selective chemistries to form trenches, following by a wet clean process. A metal material 56 is then formed within the trenches, followed by a CMP process to remove any residual material from a surface of the SiN material 14. As shown in the cross sectional view, the metal features have a tip to tip 58 alignment.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    providing a non-mandrel cut;
    providing a mandrel cut;
    forming blocking material on underlying conductive material in the non-mandrel cut and the mandrel cut;
    forming trenches with the blocking material acting as a blocking mask at the mandrel cut and the non-mandrel cut; and
    filling the trenches with metallization features such that the metallization features have a tip to tip alignment.

2. The method of claim 1, wherein the blocking material is a tip to tip mask in the non-mandrel cut and the mandrel cut.

3. The method of claim 2, wherein the tip to tip mask is Co material or Ru material.

4. The method of claim 3, wherein the Co material or the Ru material is grown on an underlying conductive material which is exposed by the non-mandrel cut and the mandrel cut.

5. The method of claim 4, wherein the Co material or the Ru material is grown on the underlying conductive material between sidewalls of selected mandrels resulting from the mandrel cut.

6. The method of claim 5, further comprising removing the selected mandrels.

7. The method of claim 6, wherein the trenches are formed between sidewall spacers that were provided on mandrels prior to the non-mandrel cut and the mandrel cut.

8. The method of claim 7, further comprising removing the Co material or material Ru material after the formation of the trenches.

9. The method of claim 8, further comprising removing the sidewall spacers and other underlying material, followed by a wet clean process, after the formation of the trenches.

10. The method of claim 3, wherein the Co material or Ru material are grown only on the conductive material and has selectivity to the mandrels and underlying material.

11. A method comprising:
 exposing a conductive material by removing masking material between sidewall spacers of selected mandrels;
 exposing the conductive material by removing other selected mandrels, while keeping the sidewall spacers associated with the other selected mandrels;
 growing blocking material on the exposed conductive material;
 forming trenches through the conductive material and underlying material, with the blocking material acting as a tip to tip blocking mask; and
 removing at least the blocking material; and
 forming metallization features in the trenches, which are aligned tip to tip.

12. The method of claim 11, wherein the removing of the masking material includes non-mandrel cuts and the removing of the other selected mandrels is a mandrel cut.

13. The method of claim 12, wherein the growing of the blocking material on the exposed conductive material includes covering previously grown blocking material formed by removing of masking material and the blocking material is grown between sidewall spacers of mandrels.

14. The method of claim 13, wherein the growing of the blocking material on the exposed conductive material includes removing mandrels to expose the conductive material and forming the conductive material at locations of the removed mandrels.

15. The method of claim 13, wherein the Co material or the Ru material has etch selectivity to the sidewall spacers, the selected mandrels and the other selected mandrels.

16. The method of claim 15, wherein prior to the forming of the metallization features in the trenches, the sidewall spacers are removed.

17. The method of claim 11, wherein the blocking material is Co material or Ru material, which grows on the conductive material.

18. The method of claim 11, wherein the growing of the blocking material on the exposed conductive material includes covering previously grown blocking material formed by removing of masking material.

19. The method of claim 11, wherein the growing of the blocking material on the exposed conductive material includes removing mandrels to expose the conductive material.

* * * * *